United States Patent
Jang et al.

(10) Patent No.: US 9,890,454 B2
(45) Date of Patent: Feb. 13, 2018

(54) ATOMIC LAYER DEPOSITION APPARATUS

(71) Applicant: Samsung Display Co., Ltd., Yongin, Gyeonggi-Do (KR)

(72) Inventors: Choel Min Jang, Seoul (KR); Suk Won Jung, Seoul (KR); Myung Soo Huh, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 391 days.

(21) Appl. No.: 14/531,170

(22) Filed: Nov. 3, 2014

(65) Prior Publication Data

US 2015/0275362 A1 Oct. 1, 2015

(30) Foreign Application Priority Data

Mar. 31, 2014 (KR) ........................ 10-2014-0038014

(51) Int. Cl.
*C23C 16/455* (2006.01)
*C23C 16/44* (2006.01)
*C23C 16/458* (2006.01)

(52) U.S. Cl.
CPC .... *C23C 16/45544* (2013.01); *C23C 16/4409* (2013.01); *C23C 16/458* (2013.01);
(Continued)

(58) Field of Classification Search
CPC ........ C23C 16/45563; C23C 16/45565; C23C 16/45574; C23C 16/4585; C23C 16/4409;
(Continued)

(56) References Cited

U.S. PATENT DOCUMENTS 5,958,140 A * 9/1999 Arami ............... C23C 16/45502
118/715
6,773,507 B2 * 8/2004 Jallepally .......... C23C 16/45521
117/102
(Continued)

FOREIGN PATENT DOCUMENTS

KR 1020040025791 A 3/2004
KR 1020040048618 A 6/2004
(Continued)

OTHER PUBLICATIONS

Machine Generated English Translation of KR 1020040025791. Published Mar. 26, 2004 held to Byeong-Ha Cho et al.*
(Continued)

*Primary Examiner* — Jeffrie R Lund
(74) *Attorney, Agent, or Firm* — Cantor Colburn LLP (57) ABSTRACT

An atomic layer deposition apparatus includes: a substrate support supporting a substrate; a first divider including a plurality of first division modules provided on the substrate support and selectively spraying a source gas, a reaction gas, and a purge gas to each of predetermined areas; and a second divider including a plurality of second division modules provided on the first divider and supplying the gases to the respective first division modules, wherein each of the plurality of second division modules is formed of a first through-hole and a second through-hole, and the gas passed through the first and second through-holes moves to the first division modules.

11 Claims, 8 Drawing Sheets

(52) U.S. Cl.
CPC .... *C23C 16/4585* (2013.01); *C23C 16/45525* (2013.01); *C23C 16/45563* (2013.01); *C23C 16/45565* (2013.01); *C23C 16/45574* (2013.01)

(58) Field of Classification Search
CPC ............ C23C 16/458; C23C 16/45544; C23C 16/45525
See application file for complete search history.

(56) References Cited

U.S. PATENT DOCUMENTS

| | | | | |
|---|---|---|---|---|
| 2003/0207032 A1* | 11/2003 | Ahn | ................... | C23C 16/4412 427/255.34 |
| 2004/0011286 A1* | 1/2004 | Kwon | ................. | C23C 16/4405 118/715 |
| 2004/0191413 A1* | 9/2004 | Park | ................. | C23C 16/45527 427/255.28 |
| 2006/0137608 A1* | 6/2006 | Choi | ....................... | C23C 16/14 118/715 |
| 2006/0225655 A1* | 10/2006 | Faguet | ................ | C23C 16/4401 118/723 R |
| 2008/0110399 A1* | 5/2008 | Park | ................. | C23C 16/45504 118/715 |
| 2009/0047426 A1* | 2/2009 | Park | .................. | C23C 16/45508 427/248.1 |
| 2009/0078204 A1 | 3/2009 | Kerr et al. | | |
| 2010/0119727 A1* | 5/2010 | Takagi | .............. | C23C 16/45521 427/532 |
| 2012/0141676 A1* | 6/2012 | Sershen | ............ | C23C 16/45551 427/255.23 |
| 2015/0072453 A1* | 3/2015 | Jang | .................. | C23C 16/45551 438/28 |
| 2015/0275362 A1* | 10/2015 | Jang | .................. | C23C 16/45544 427/255.28 |

FOREIGN PATENT DOCUMENTS

KR    1020130007192 A    1/2013
KR    10-1267530 B1    5/2013

OTHER PUBLICATIONS

Machine Generated English Translation of KR 20130007192. Published Jan. 18, 2013 held to Seung Hun Kim et al.*
Machine Generated English Translation of KR 1020040048618. Published Jun. 10, 2004 held to Gil Hyeon Choi et al.*

* cited by examiner

ATOMIC LAYER DEPOSITION APPARATUS

This application claims priority to Korean Patent Application No. 10-2014-0038014 filed on Mar. 31, 2014, and all the benefits accruing therefrom under 35 U.S.C. § 119, the entire contents of which are incorporated herein by reference.

BACKGROUND (a) Field

The invention relates to an atomic layer deposition apparatus and an atomic layer deposition method using the same.

(b) Description of the Related Art

An atomic layer deposition apparatus forms a thin film on a substrate through a surface reaction on the substrate while ejecting a source gas and a reaction gas in time division. A film deposited by the atomic layer deposition apparatus has an excellent coating property and excellent uniformity.

The source gas and the reaction gas are sequentially ejected to a substrate surface and a thin film can be formed through a surface reaction on the substrate surface.

SUMMARY

An atomic layer deposition apparatus may continuously perform a process by circularly arranging a plurality of reaction chambers, or by an individual substrate sheet passing through a plurality of reaction chambers. However, circularly arranging the plurality of reaction chambers or the individual substrate sheet passing through a plurality of reaction chambers undesirably increases a size of the atomic layer deposition apparatus and a time for lamination of a thin film on the substrate sheet.

One or more exemplary embodiment provides an atomic layer deposition apparatus that can decrease a lamination time for forming a specific thin film on a substrate and that can reduce a length of the atomic layer deposition apparatus, and an atomic layer deposition method using the atomic layer deposition apparatus.

One or more exemplary embodiment provides the atomic layer deposition apparatus and the atomic layer deposition method that can prevent a source gas and a reaction gas sprayed for forming the specific thin film on the substrate from remaining in the atomic layer deposition apparatus.

An exemplary embodiment of an atomic layer deposition apparatus according to the invention includes: a substrate support configured to support a substrate; a first divider on the substrate support and including a plurality of first division modules configured to selectively spray a source gas, a reaction gas and a purge gas to predetermined areas of the substrate; and a second divider on the first divider and including a plurality of second division modules configured to supply the source gas, the reaction gas and the purge gas to the first division modules, respectively. A first through-hole and a second through-hole are defined in each of the plurality of second division modules, and a gas passed through the first and second through-holes of the second division modules moves to the first division modules.

The atomic layer deposition apparatus may further include a sealing portion between the substrate support and the first divider and surrounding the substrate.

The thickness of the sealing portion may be from about 1.5 millimeters (mm) to about 2 mm.

Each of a first division module among the plurality of first division modules may include an inlet connected with the first through-hole and the second through-hole, and an outlet through which the gas drawn in through the inlet is sprayed to the substrate.

The outlet may be disposed in a center of the first division module.

The first through-hole and the second through-hole may be symmetrical with respect to the outlet of the first division module.

The outlet may have the shape of a slit.

The outlet may be open in a direction perpendicular to an extension direction of the substrate support.

The atomic layer deposition apparatus may further include a gas supply configured to supply the source gas, the reaction gas and the purge gas to the second divider.

The gas supply may include a first supply module configured to selectively supplying the source gas and the purge gas to the first through-hole, and a second supply module configured to selectively supplying the reaction gas and the purge gas to the second through-hole.

The gas supply may be configured to selectively supply the source gas, the reaction gas and the purge gas to each of the first through-hole and the second through-hole.

An exemplary embodiment of an atomic layer deposition method according to the invention includes: positioning the substrate on the substrate support of the atomic layer deposition apparatus described above; spraying the source gas to each of the predetermined areas of the substrate through the first divider; first spraying the purge gas to the predetermined areas through the first divider, after the spraying the source gas; spraying the reaction gas to the predetermined areas through the first divider, after the first spraying the purge gas; and second spraying the purge gas to the predetermined areas through the first divider, after the spraying the reaction gas.

The spraying the source gas may include providing the source gas and the purge gas to the first division modules through the first through-hole and the second through-hole of the second divider, respectively, and spraying the source gas together with the purge gas through the first division modules, after the providing the source gas and the purge gas to the first division modules through the first through-hole and the second through-hole of the second divider, respectively.

The first and second spraying the purge gas may include providing the purge gas to the first division modules through each of the first and second through-holes of the second divider.

The spraying the reaction gas may include providing the purge gas and the reaction gas to the first division modules through the first through-hole and the second through-hole of the second divider, respectively, and spraying the reaction gas together with the purge gas through the first division modules, after the providing the purge gas and the reaction gas to the first division modules through the first through-hole and the second through-hole of the second divider, respectively.

According to one or more exemplary embodiment of the invention, the atomic layer deposition apparatus and the atomic layer deposition method can shorten a time for forming a specific thin film in a substrate by laminating a source gas and/or a reaction gas at the same time in each of a plurality of predetermined areas of the substrate.

In addition, a purge gas is simultaneously sprayed when spraying the source gas and the reaction gas, respectively, so as to emit a source gas and a reaction gas remaining in the deposition apparatus.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION

The invention will be described more fully hereinafter with reference to the accompanying drawings, in which exemplary embodiments of the invention are illustrated. As those skilled in the art would realize, the described exemplary embodiments may be modified in various different ways, all without departing from the spirit or scope of the invention. On the contrary, exemplary embodiments introduced herein are provided to make disclosed contents thorough and complete, and sufficiently transfer the spirit of the invention to those skilled in the art. In the drawings, the thickness of layers, films, panels, regions, etc., are exaggerated for clarity. It will be understood that when a layer is referred to as being "on" another layer or substrate, it can be directly on the other layer or substrate or intervening elements may also be present. Like reference numerals designate like elements throughout the specification. As used herein, connected may refer to elements being physically, electrically and/or fluidly connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Figure 1:
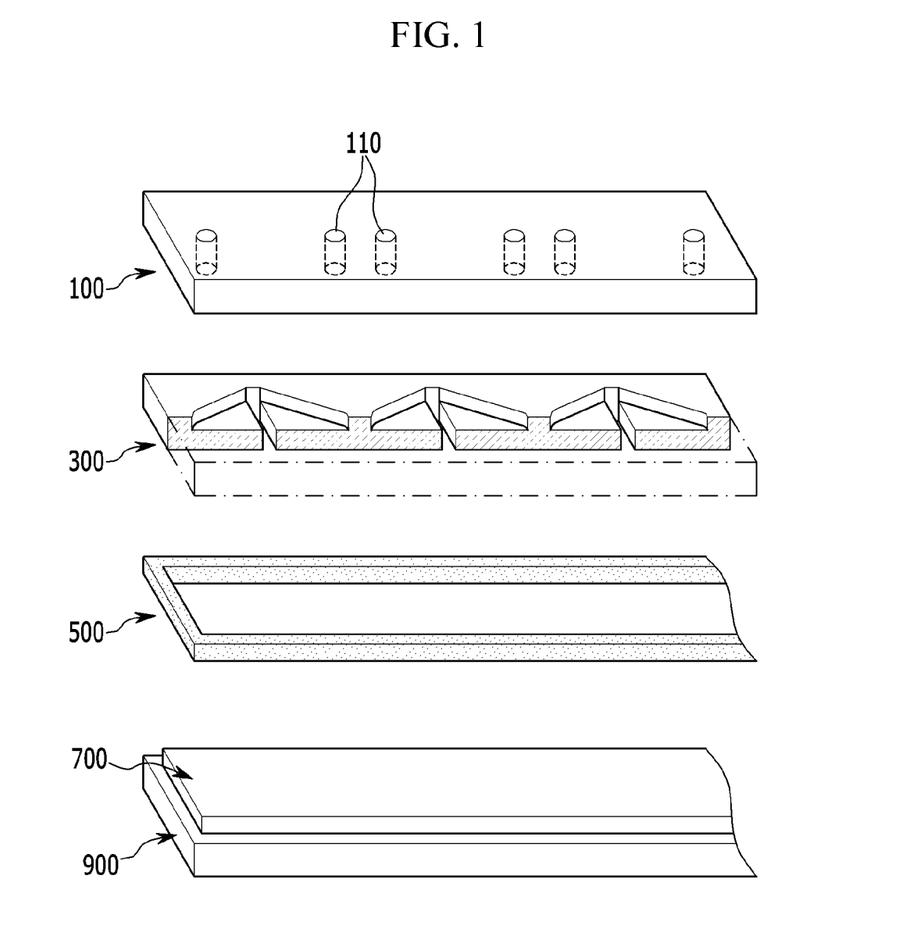
FIG. 1 is a schematic exploded view of an exemplary embodiment of an atomic layer deposition apparatus according to the invention.
Figure 2:
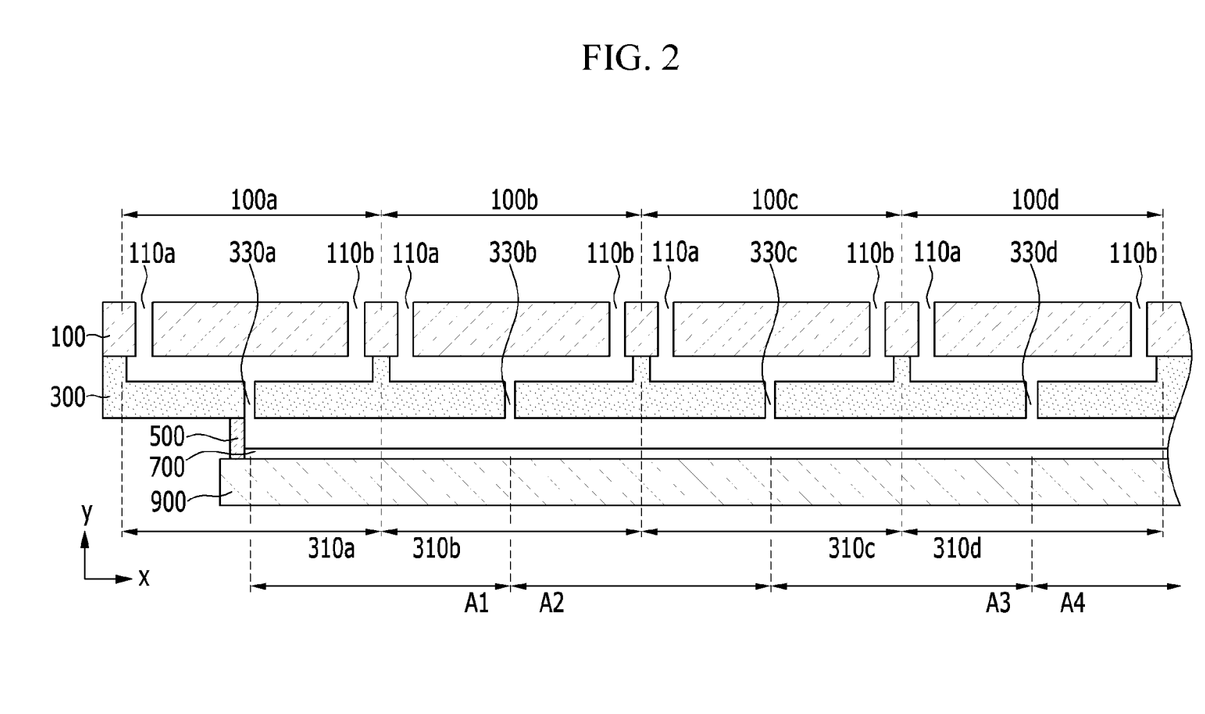
FIG. 2 is a cross-sectional view of the atomic layer deposition apparatus.

Referring to FIG. 1 and FIG. 2, an exemplary embodiment of an atomic layer deposition apparatus according to the invention includes a substrate support 900, a first divider 300, a second divider 100 and a sealing portion 500 configured to simultaneously eject a deposition material to predetermined areas of a substrate, while reducing or effectively preventing the substrate from moving during a deposition process in which the atomic layer deposition apparatus is used.

First, referring to FIG. 1 and FIG. 2, the substrate support 900 is configured to fix a substrate 700, which is a deposition target, in a position or location. The substrate support 900 is fixed while a deposition material is deposited on the substrate 700.

According to an exemplary embodiment of the invention, the substrate support 900 is fixed while maintaining a vacuum state between the substrate support 900 and the first divider 300 during deposition of the deposition material to the substrate 700.

The substrate support 900 may have the shape of a flat panel to support the substrate 700 disposed on an upper portion thereof. In addition, the substrate support 900 may be larger in a plan view of the substrate 700 to wholly support the substrate 700.

The first divider 300 is provided above the substrate support 900 with a predetermined gap therefrom. The first divider 300 may selectively spray a source gas, a reaction gas and a purge gas to areas of the substrate 700. Alternatively, the first divider 300 may spray the gas to every predetermined area of the substrate 700.

The first divider 300 may be collectively formed of a plurality of first division modules 310*a*, 310*b*, 310*c* and 310*d*.

The plurality of first division modules 310*a*, 310*b*, 310*c* and 310*d* respectively sprays a gas to each of predetermined areas A1, A2, A3 and A4 of the substrate 700. That is, the first division module 310*a* may spray the gas to the area A1 of the substrate 700, the first division module 310*b* may spray the gas to the area A2 of the substrate 700, the first division module 310*c* may spray the gas to the area A3 of the substrate 700, and the first division module 310*d* may spray the gas to the area A4 of the substrate 700.

Thus, the gas can be simultaneously sprayed to the entire area of the substrate 700 by the plurality of first division modules 310*a*, 310*b*, 310*c* and 310*d*.

Referring to FIG. 2 to FIG. 6, inlets and outlets 330*a*, 330*b*, 330*c*, 330*d* may be defined in the first division modules 310*a*, 310*b*, 310*c* and 310*d*, respectively. The inlets and the outlets of each of 330*a*, 330*b*, 330*c* and 330*d* are respectively opened to above and below the first division modules 310*a*, 310*b*, 310*c* and 310*d*. The inlet portion and the outlet portion of each of 330*a*, 330*b*, 330*c* and 330*d* are connected with each other, such as through a passage within a body of the first divider 300.

Figure 6:
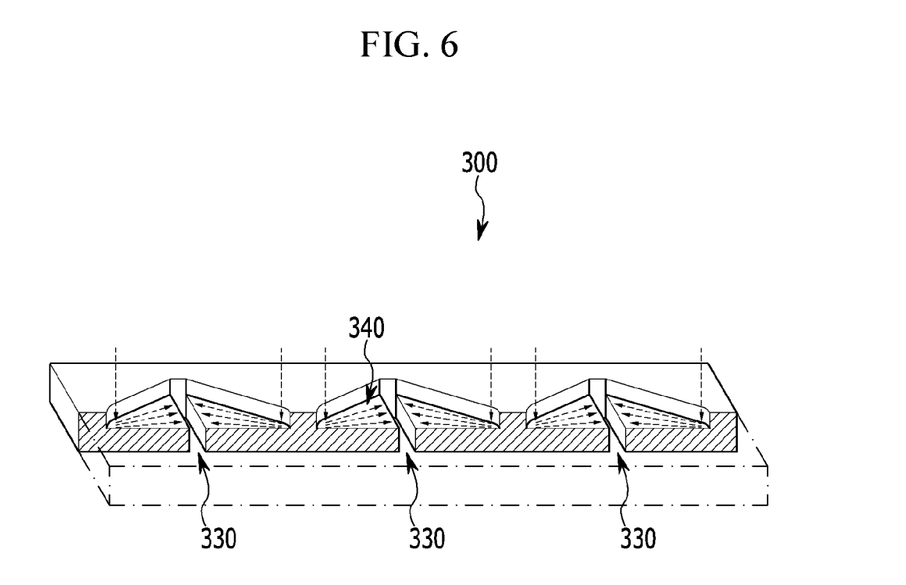
FIG. 6 is a schematic perspective view of an exemplary embodiment of a first divider of an atomic layer deposition apparatus according to the invention.

The inlets of the first divider 300 may be connected with a plurality of through-holes 110 such as first and second through-holes 110*a* and 110*b* of the second divider 100. As shown in FIG. 2 and FIG. 6, the inlets may be formed by grooves 340 recessed from the upper surfaces of the first division modules 310*a*, 310*b*, 310*c* and 310*d* and connected to the upper side opening of a respective first divider inlet/outlet 330.

That is, the inlet portions of 330*a*, 330*b*, 330*c* and 330*d* receive gas passed through the first and second through-holes 110*a* and 110*b* and transmit the received gas to the outlet portions of 330*a*, 330*b*, 330*c* and 330*d* opened to below the first division modules 310*a*, 310*b*, 310*c* and 310*d*.

The outlet portions of 330*a*, 330*b*, 330*c* and 330*d* may be defined in the lower center of the first division modules 310*a*, 310*b*, 310*c* and 310*d*. As illustrated in FIG. 2, for example, the outlet portions of 330*a*, 330*b*, 330*c* and 330*d* may be respectively provided at the left sides of the respective areas A1, A2, A3 and A4.

Figure 3:
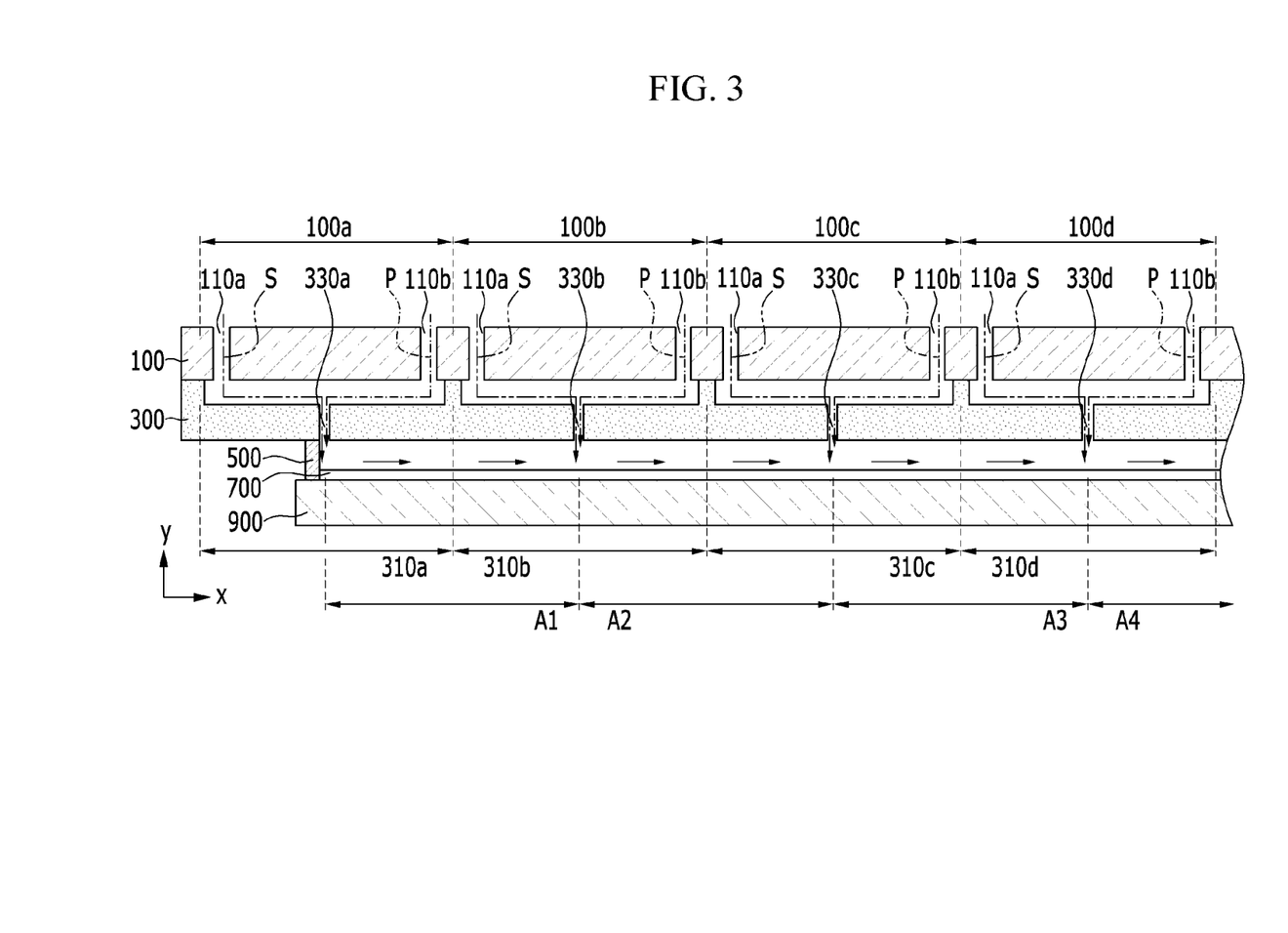
FIG. 3 to FIG. 5 illustrate an exemplary embodiment of an atomic layer deposition process of an atomic layer deposition method according to the invention.
Figure 4:
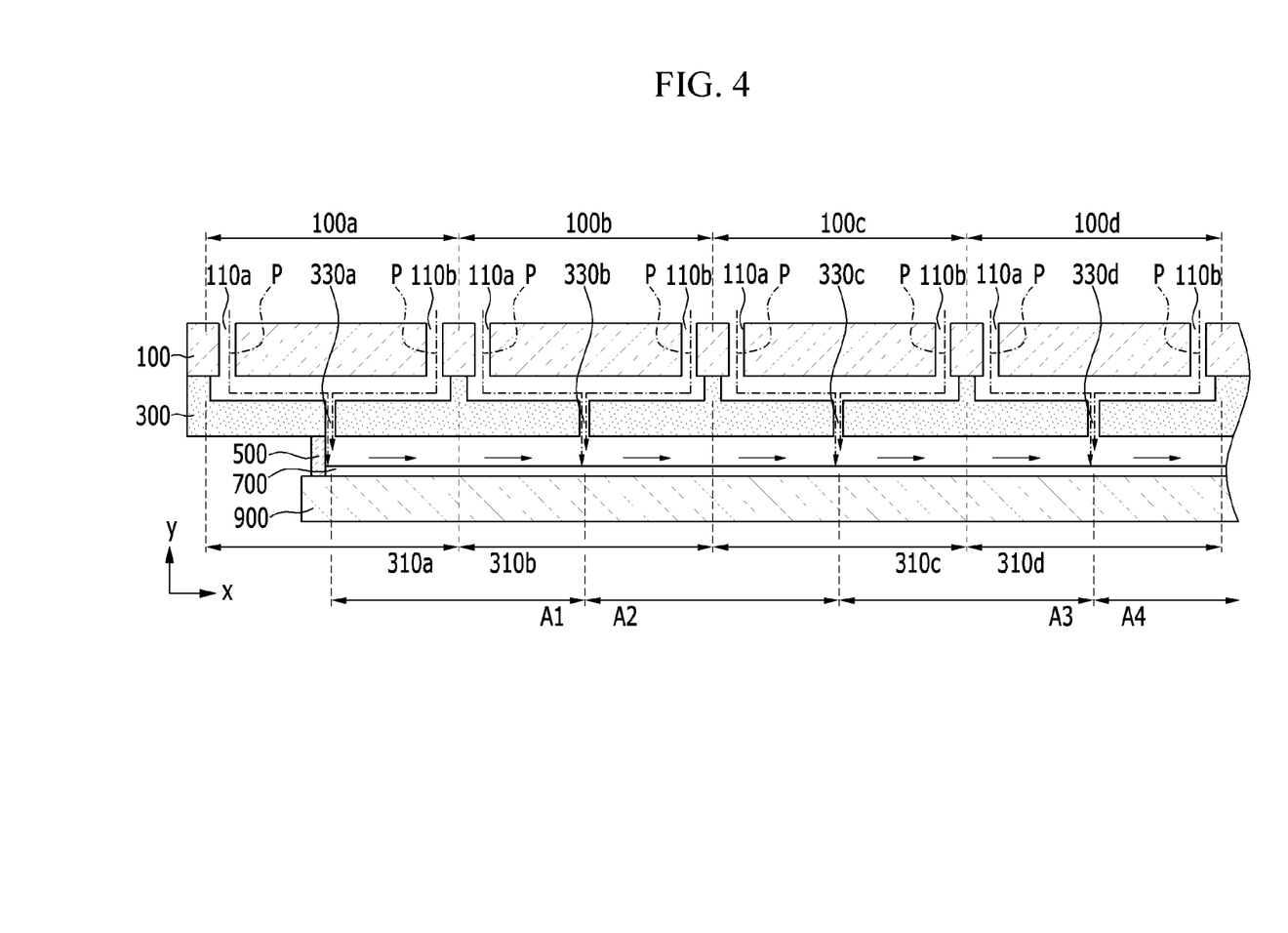
Figure 5:
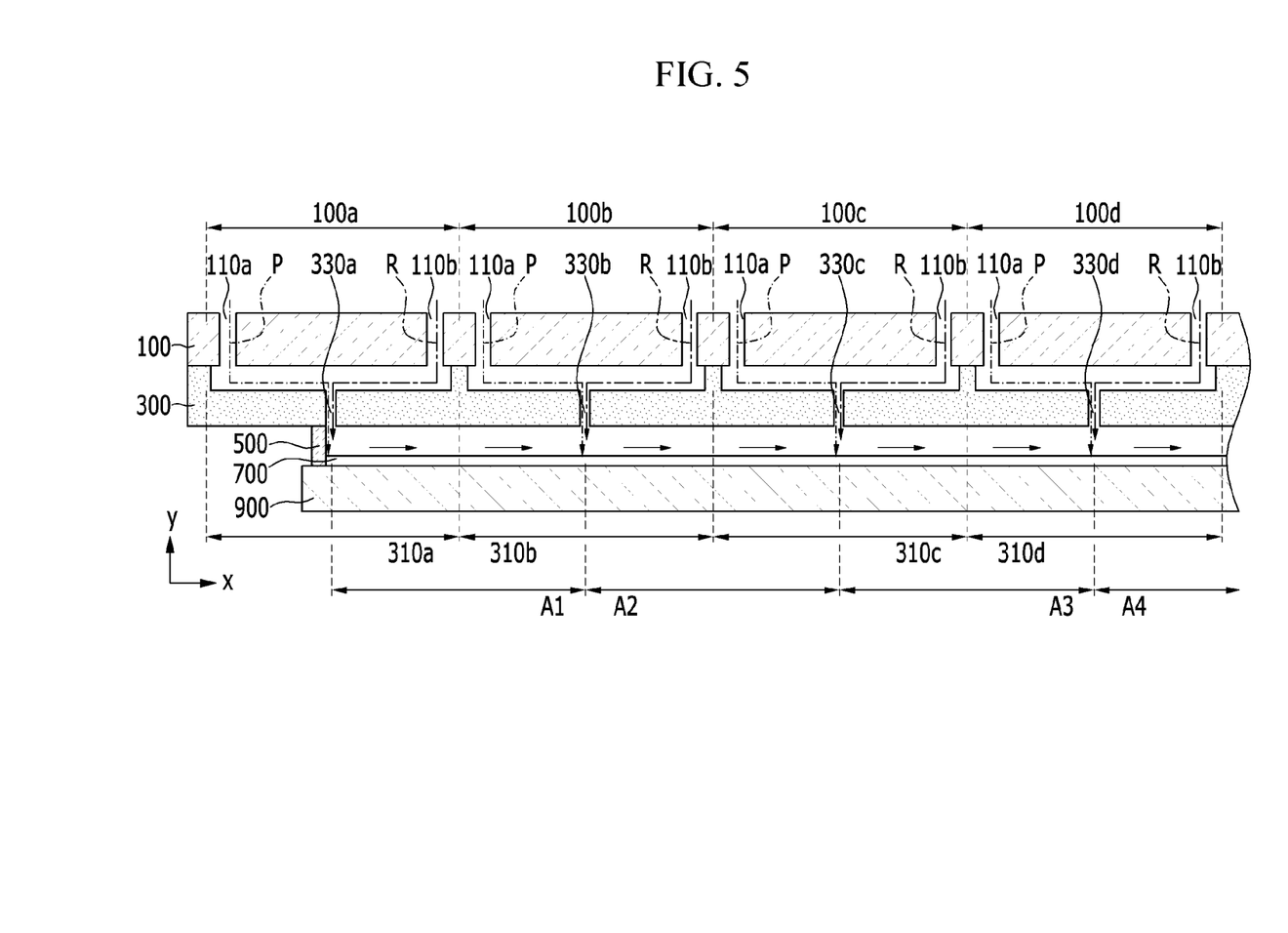

As shown in FIG. 3 to FIG. 5, gases sprayed through the outlet portions of 330*a*, 330*b*, 330*c* and 330*d* move to the right side, that is, an X direction which is an extension direction of the substrate support 900 from the left sides of the respective areas A1, A2, A3 and A4.

That is, the gases sprayed through the respective outlet portions of 330*a*, 330*b*, 330*c* and 330*d* may be laminated on the upper surface of the substrate 700 while moving in the X direction in the respective areas A1, A2, A3 and A4. Thus, the gases sprayed through the outlets 330*a*, 330*b*, 330*c* and 330*d* may be simultaneously laminated to the entire area of the substrate 700.

Pressure at the right end in FIG. 2 is lower than pressure at other portions in the vacuum space formed between the first divider 300 and the substrate support 900. Accordingly, the gases sprayed through the outlet portions of 330*a*, 330*b*, 330*c* and 330*d* move along the X direction.

The outlet portions of 330*a*, 330*b*, 330*c* and 330*d* may have the shape of a slit. The slit may include a relatively longer length than width thereof. As shown in FIG. 6, the outlet portions of 330*a*, 330*b*, 330*c* and 330*d* at a lower surface of the first divider 300 are opened at the bottom surface thereof in a direction that is perpendicular to the X direction, that is, the Y direction. The length of each slit defined in the first divider may be greater than a width of the substrate 700, in the Y direction. A length of the substrate 700 is taken in the X direction.

As described, since the outlet portions 330*a*, 330*b*, 330*c* and 330*d* have the shape of a slit, the gases sprayed through the outlet portions of 330*a*, 330*b*, 330*c* and 330*d* may be laminated to the substrate 700 while wholly covering the substrate 700 in the width direction thereof. Thus, the sprayed gas is laminated to the respective areas A1, A2, A3 and A4 of the substrate 700 along the length (X) direction thereof while wholly covering the substrate 700 in the width (Y) direction thereof.

A height of the vacuum space formed between the first divider 300 and the substrate support 900 may be about 1.5 millimeters (mm) to about 2 mm. The height of the vacuum space formed between the first divider 300 and the substrate support 900 may be the same as a thickness of the sealing portion 500. The height of the vacuum space and the thickness of the sealing portion 500 are taken in a direction perpendicular to both the X and Y directions.

Referring to FIG. 2, the second divider 100 is provided on the first divider 300. The second divider 100 is configured to supply a gas to the first divider 300.

The second divider 100 is collectively formed by a plurality of second division modules 100*a*, 100*b*, 100*c* and 100*d*.

Each of the second division modules 100*a*, 100*b*, 100*c* and 100*d* includes a first through-hole 110*a* and a second through-hole 110*b* defined therein. The second division modules 100*a*, 100*b*, 100*c* and 100*d* are configured to receive gases from a gas supply and transmit the received gases to the first division modules 310*a*, 310*b*, 310*c* and 310*d*, respectively.

As shown in FIG. 2, the second division modules 100*a*, 100*b*, 100*c* and 100*d* respectively correspond to the first division modules 310*a*, 310*b*, 310*c* and 310*d*. That is, the second division module 100*a* is connected with the first division module 310*a*, the second division module 100*b* is connected with the first division module 310*b*, the second division module 100*c* is connected with the first division module 310*c*, and the second division module 100*d* is connected with the first division module 310*d*.

Referring to FIG. 2 to FIG. 6, the first and second through-holes 110*a* and 110*b* are disposed to be symmetrical to each other with respect to the inlets and outlets 330*a*, 330*b*, 330*c* and 330*d*. As an example, the first and second through-holes 110*a* and 110*b* are defined in the second division module 100*a* so as to be symmetrical with respect to the input and output 330*a* of the first division module 310*a*. Thus, as an example, the gases supplied respectively through the first through-hole and the second through-hole 110*a* and 110*b* move to the outlet 330*a* at a center of the first division module 310*a* and are then sprayed to the substrate 700.

The first through-hole 110*a* and the second through-hole 110*b* may be respectively connected with the gas supply.

Figure 7:
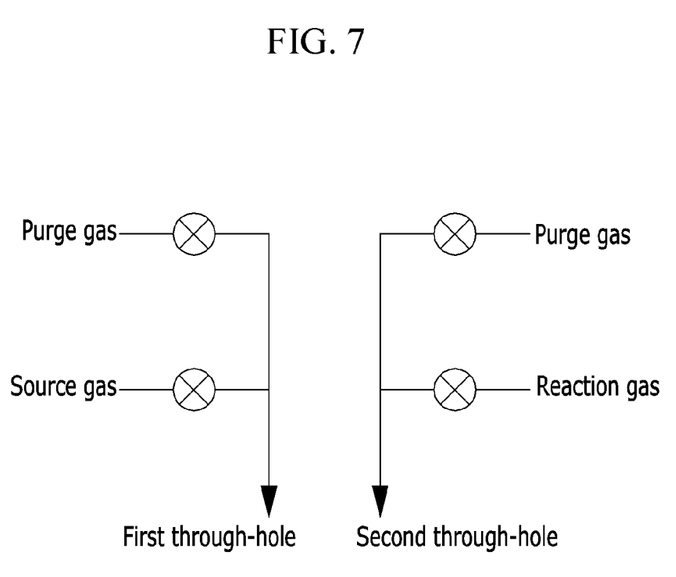
FIG. 7 and FIG. 8 are schematic diagrams of exemplary embodiments of a gas supply of an atomic layer deposition apparatus according to the invention.

Referring to FIG. 7, the first through-hole 110*a* may selectively receive the source gas or the purge gas from the gas supply (not shown). That is, the source gas or the purge gas may be supplied through the first through-hole 110a.

The second through-hole 110b may selectively receive the reaction gas or the purge gas from the gas supply. That is, the reaction gas or the purge gas may be supplied through the second through-hole 110b.

Here, the type of source gas may be changed according to the type of the substrate 700 and/or the type of a thin film to be deposited on the substrate 700. In an exemplary embodiment, for example, for deposition of a silicon thin film, the source gas may be one of silane ($SiH_4$) including silicon, tetraethyl orthosilicate ("TEOS") and silicon tetrafluoride ($SiF_4$), and the reaction gas may be one of nitrogen ($N_2$), oxygen ($O_2$), argon (Ar), ammonia ($NH_3$) and hydrogen ($H_2$), or a combination of two of more gases. In addition, the purge gas may be a relatively stable gas that does not chemically react with the source gas, the reaction gas, the substrate 700 and/or the thin film formed on the substrate 700.

Figure 8:
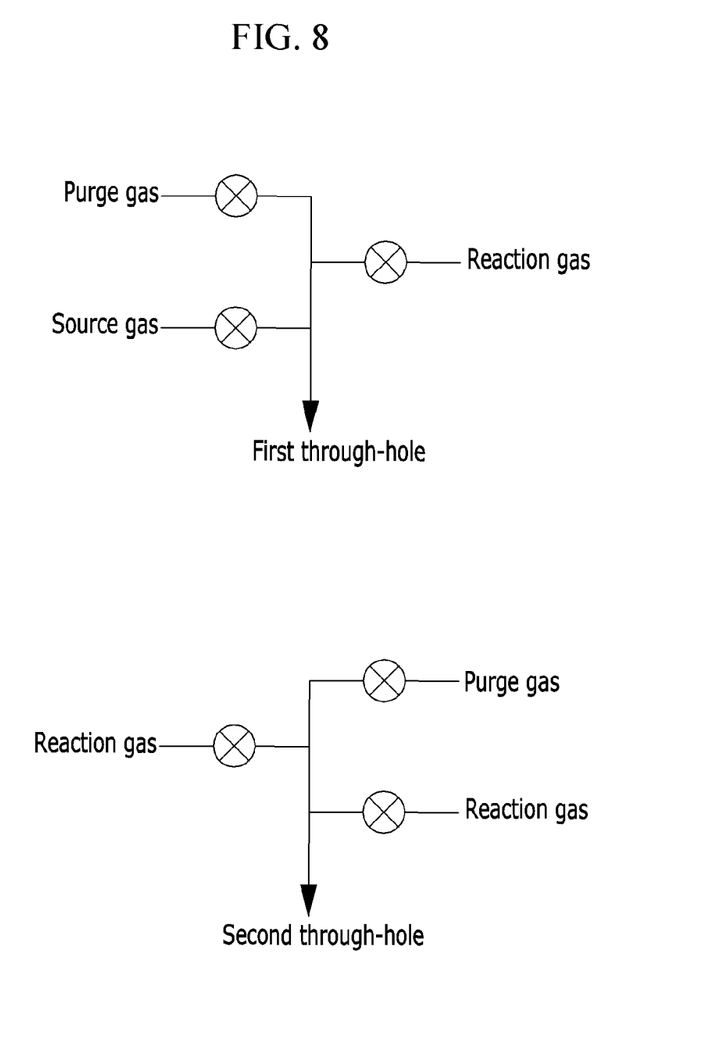

As another exemplary embodiment, as shown in FIG. 8, the first through-hole 110a and the second through-hole 110b may selectively receive the source gas, the reaction gas and/or the purge gas from the gas supply. That is, the source gas, the reaction gas and the purge gas may be supplied through the first and second through-holes 110a and 110b.

Referring to FIG. 7 and FIG. 8, as previously described, the gas supply may be combined with the second divider 100. Where the gas supply is combined with the second divider 100, the gas supply may include a first supply module and a second supply module. The gas supply may supply the source gas or the purge gas to the first through-hole 110a through the first supply module. In addition, the gas supply may supply the reaction gas or the purge gas to the second through-hole 110b through the second supply module.

The gas supply supplies the purge gas after supplying the source gas or the reaction gas during the deposition process so that lamination of the source gas or the reaction gas within the gas supply, the first divider or the second divider can be reduced or effectively prevented. This will be described in detail in an exemplary embodiment of an atomic layer deposition method using the atomic layer deposition apparatus according to the invention.

Referring again to FIG. 1 and FIG. 2, the sealing portion 500 may be provided between the first divider 300 and the substrate support 900.

The sealing portion 500 is disposed between the first divider 300 and the substrate support 900 while surrounding the substrate 700, so as to form a vacuum state between the first divider 300 and the substrate support 900.

As shown in FIG. 1, the sealing portion 500 may have the shape of a ring.

According to the exemplary embodiment of the invention, the thickness of the sealing portion 500 may be about 1.5 mm to about 2 mm. In an exemplary embodiment, the sealing portion 500 may include polytetrafluoroethylene such as Teflon®. However, the material of the sealing portion 500 is not limited thereto, and various materials having a sealing property for which a vacuum state can be formed between the first divider 300 and the substrate support 900 may be used.

Hereinafter, referring to FIG. 3 to FIG. 5, a method for deposition of an atomic layer to a substrate using the above-described atomic layer deposition apparatus will be described in detail. FIG. 3 to FIG. 5 show an exemplary embodiment of an atomic layer deposition process of an atomic layer deposition method according to the invention.

Referring to FIG. 3, the substrate 700 is located on the substrate support 900. The source gas and the purge gas are sprayed via the first division modules 330a, 330b, 330c and 330d of the first divider 300.

Each of the plurality of first division modules 310a, 310b, 310c and 310d sprays a gas to one of the predetermined areas A1, A2, A3 and A4 of the substrate 700. That is, the first division module 310a sprays the gas to the area A1 of the substrate 700, the first division module 310b sprays the gas to the area A2 of the substrate 700, the first division module 310c sprays the gas to the area A3 of the substrate 700, and the first division module 310d sprays the gas to the area A4 of the substrate 700.

Accordingly, the gas can be simultaneously sprayed to the entire area of the substrate 700 through the plurality of first division modules 310a, 310b, 310c and 310d.

The source gas S is supplied via the first through-hole 110a and the purge gas P is supplied via the second through-hole 110b of the first divider. The source gas S and the purge gas P respectively supplied through the first and second through-holes 110a and 110b may be sprayed together (e.g., simultaneously) to the substrate 700 through the first division modules 310a, 310b, 310c and 310d.

Only the source gas S among the source gas S and the purge gas P sprayed through the first division modules 310a, 310b, 310c and 310d is deposited to the substrate 700.

The purge gas P is supplied via the second through-hole 110b in order to emit the reaction gas that may remain in the second through-hole 110b or the gas supply. Here, a deposition cycle is repeated in the atomic layer deposition method and thus a reaction gas may remain in the second through-hole 110b or the gas supply after being emitted in the previous stage or cycle.

Next, referring to FIG. 4, the purge gas P is sprayed to the substrate 700 after deposition of the source gas A to the substrate 700.

Each of the plurality of first division modules 310a, 310b, 310c and 310d sprays the purge gas to one of the predetermined areas A1, A2, A3 and A4 of the substrate 700. That is, the first division module 310a sprays the gas to the area A1 of the substrate 700, the first division module 310b sprays the gas to the area A2 of the substrate 700, the first division module 310c sprays the gas to the area A3 of the substrate 700, and the first division module 310d sprays the gas to the area A4 of the substrate 700.

Accordingly, the purge gas P can be simultaneously sprayed to the entire area of the substrate 700 through the plurality of first division modules 310a, 310b, 310c and 310d.

The purge gas P is supplied via the first and second through-holes 110a and 110b. The supplied purge gas P may be sprayed to the substrate 700 via the first division modules 310a, 310b, 310c and 310d.

The purge gas P is supplied via the first and second through-holes 110a and 110b so that the source gas S remaining in the first and second dividers 300 and 100 can be emitted. Accordingly, lamination in the first and second dividers 100 and 300 of the source gas S can be reduced or effectively prevented.

Referring to FIG. 5, the reaction gas R and the purge gas P are sprayed via the first division modules 330a, 330b, 330c and 330d of the second divider 300.

Each of the plurality of first division modules 310a, 310b, 310c and 310d sprays the gas to one of the predetermined areas A1, A2, A3 and A4 of the substrate 700. That is, the first division module 310a sprays the gas to the area Al of the substrate 700, the first division module 310b sprays the gas to the area A2 of the substrate 700, the first division module 310c sprays the gas to the area A3 of the substrate 700, and the first division module 310d sprays the gas to the area A4 of the substrate 700.

Accordingly, the gas can be simultaneously sprayed to the entire area of the substrate 700 via the plurality of first division modules 310a, 310b, 310c, and 310d.

The purge gas P is supplied via the first through-hole 110a and the reaction gas R is supplied via the second through-hole 110b. The purge gas P and the reaction gas R respectively supplied via the first and second through-holes 110a and 110b can be sprayed together to the substrate 700 via the first division modules 310a, 310b, 310c and 310d.

The purge gas P is supplied via the first through-hole 110a to emit the source gas S remaining in the first through-hole 110a and/or the gas supply.

Only the reaction gas R among the purge gas P and the reaction gas R sprayed through the first division modules 310a, 310b, 310c and 310d is deposited to the substrate 700.

In the exemplary embodiment of an atomic layer deposition process of an atomic layer deposition method, the source gas S is firstly laminated to the substrate 700 and the reaction gas R applied thereafter are combined such that a specific thin film such as for a display device can be formed.

After the reaction gas R is deposited to the substrate 700, the purge gas P is sprayed to the substrate 700 to emit the reaction gas R remaining in the second through-hole 110b and/or the gas supply.

Referring again to FIG. 4, the plurality of first division modules 310a, 310b, 310c and 310d respectively spray the purge gas P to the predetermined areas A1, A2, A3 and A4 of the substrate 700.

In FIG. 4, the purge gas P is supplied through the first and second through-holes 110a and 110b. The supplied purge gas P may be sprayed to the substrate 700 through the first division modules 310a, 310b, 310c and 310d.

Similarly, with reference to FIG. 4, after the reaction gas R is deposited to the substrate 700 the purge gas P is supplied through the first and second through-holes 110a and 110b so that the reaction gas R remaining in the first and second dividers 300 and 100 can be emitted. Accordingly, lamination in the first and second dividers 100 and 300 of the reaction gas R can be reduced or effectively prevented.

In an exemplary embodiment of the atomic layer deposition method according to the invention, a process that sequentially laminates the source gas, the purge gas, the reaction gas and the purge gas forms a single cycle. The atomic layer deposition method according to the exemplary embodiment can be collectively performed by repeating the cycle.

One or more exemplary embodiment of the atomic layer deposition apparatus and the atomic layer deposition method simultaneously ejects a gas to each of the predetermined areas of a substrate while fixing the substrate during the deposition process. In addition, one or more exemplary embodiment of the atomic layer deposition apparatus and the atomic layer deposition method emits the source gas and the reaction gas remaining inside the first and second dividers by simultaneously spraying the purge gas, when spraying the source gas and the reaction gas, respectively.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. An atomic layer deposition apparatus comprising:
    a substrate support configured to support a substrate;
    a first divider on the substrate support and comprising a plurality of first division modules configured to selectively spray a source gas, a reaction gas and a purge gas to predetermined areas of the substrate; and
    a second divider on the first divider and comprising a plurality of second division modules configured to supply the source gas, the reaction gas and the purge gas to inlets of the first division modules, respectively, wherein
    a first through-hole and a second through-hole are defined in each of the plurality of second division modules, the first through-hole and the second through-hole connected to a single one inlet among the inlets of the plurality of first division modules, the first and second through-holes disposed non-overlapping with the single one inlet connected thereto, and
    a gas passed through the first and second through-holes of the second division modules moves to the first division modules.

2. The atomic layer deposition apparatus of claim 1, further comprising a sealing portion between the substrate support and the first divider, and surrounding the substrate in a plan view.

3. The atomic layer deposition apparatus of claim 2, wherein a thickness of the sealing portion is about 1.5 millimeters to about 2 millimeters.

4. The atomic layer deposition apparatus of claim 1, wherein each of a first division module among the plurality of first division modules comprises:
    the single one inlet connected with the first through-hole and the second through-hole of the each of the second division modules, and
    an outlet through which the gas passed through the first and second through-holes of the second division modules and drawn in through the inlet is sprayed to the substrate.

5. The atomic layer deposition apparatus of claim 4, wherein the outlet is disposed at a center of the first division module.

6. The atomic layer deposition apparatus of claim 5, wherein the first through-hole and the second through-hole of the each of the second division modules are symmetrical with respect to the single one inlet of the first division module.

7. The atomic layer deposition apparatus of claim 5, wherein the outlet of the first division module has a shape of a slit.

8. The atomic layer deposition apparatus of claim 7, wherein the outlet of the first division module is open in a direction perpendicular to an extension direction of the substrate support.

9. The atomic layer deposition apparatus of claim 1, further comprising a gas supply configured to supply the source gas, the reaction gas and the purge gas to the second divider.

10. The atomic layer deposition apparatus of claim 9, wherein the gas supply comprises:
    a first supply module configured to selectively supply the source gas and the purge gas to the first through-hole of the each of the second division modules of the second divider, and a second supply module configured to selectively supply the reaction gas and the purge gas to the second through-hole of the each of the second division modules of the second divider.

11. The atomic layer deposition apparatus of claim 9, wherein the gas supply is configured to selectively supply the source gas, the reaction gas and the purge gas to each of the first through-hole and the second through-hole of the each of the second division modules of the second divider.

* * * * *